(12) United States Patent
Nakaya (10) Patent No.: US 11,350,541 B2
(45) Date of Patent: May 31, 2022

(54) BACK-UP POWER SUPPLY SYSTEM AND BACK-UP BATTERY RACK FOR DATA CENTER

(71) Applicant: Panasonic Intellectual Property Management Co., Ltd., Osaka (JP)

(72) Inventor: Satoshi Nakaya, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/048,890

(22) PCT Filed: Jan. 17, 2019

(86) PCT No.: PCT/JP2019/001333
§ 371 (c)(1),
(2) Date: Oct. 19, 2020

(87) PCT Pub. No.: WO2019/207852
PCT Pub. Date: Oct. 31, 2019

(65) Prior Publication Data
US 2021/0168964 A1    Jun. 3, 2021

(30) Foreign Application Priority Data
Apr. 23, 2018    (JP) .............................. JP2018-082536

(51) Int. Cl.
*G06F 1/26* (2006.01)
*H05K 7/14* (2006.01)
(Continued)

(52) U.S. Cl.
CPC ........... *H05K 7/1492* (2013.01); *G06F 1/263* (2013.01); *H02J 7/0063* (2013.01); *H02J 9/00* (2013.01)

(58) Field of Classification Search
None
See application file for complete search history.

(56) References Cited

U.S. PATENT DOCUMENTS

| 10,386,421 B2* | 8/2019 | Ebrahimzadeh ..... G01R 31/386 |
| 2002/0156537 A1* | 10/2002 | Sakakibara ........... H02J 7/0026 700/1 |

(Continued)

FOREIGN PATENT DOCUMENTS

| JP | 2003-244854 | 8/2003 |
| JP | 2011-216329 | 10/2011 |
| WO | 2011/162014 | 12/2011 |

OTHER PUBLICATIONS

International Search Report of PCT application No. PCT/JP2019/001333 dated Feb. 26, 2019.
(Continued)

Primary Examiner — Danny Chan
(74) Attorney, Agent, or Firm — WHDA, LLP (57) ABSTRACT

A data center includes a server rack and a back-up battery rack. The back-up battery rack includes a plurality of battery modules, each of which has completed a primary usage as an emergency power source for the server rack. A monitoring device determines a system configuration of the plurality of battery modules in the back-up battery rack, based on a specification required for the back-up battery rack and a history characteristic of each of the battery modules that has completed the primary usage in the server rack.

7 Claims, 9 Drawing Sheets

(51) Int. Cl.
*H02J 7/00* (2006.01)
*H02J 9/00* (2006.01)

(56) References Cited

U.S. PATENT DOCUMENTS

| | | |
|---|---|---|
| 2011/0239445 A1 | 10/2011 | Ibi et al. |
| 2013/0018610 A1* | 1/2013 | Yamauchi ......... H01M 10/4207 |
| | | 702/63 |
| 2013/0085696 A1* | 4/2013 | Xu ....................... G01R 31/367 |
| | | 702/63 |
| 2013/0090872 A1 | 4/2013 | Kurimoto |
| 2014/0017528 A1 | 1/2014 | Uehara et al. |
| 2015/0177808 A1* | 6/2015 | Sarti .......................... G06F 1/30 |
| | | 713/300 |
| 2016/0162849 A1* | 6/2016 | Matsuyama ............ B60L 58/18 |
| | | 705/305 |

OTHER PUBLICATIONS

Extended (Supplementary) European Search Report dated May 31, 2021, issued in counterpart EP application No. 19791819.6. (8 pages).

* cited by examiner

BACK-UP POWER SUPPLY SYSTEM AND BACK-UP BATTERY RACK FOR DATA CENTER

CROSS-REFERENCE TO RELATED APPLICATIONS

This application is a U.S. national stage application of the PCT International Application No. PCT/JP2019/001333 filed on Jan. 17, 2019, which claims the benefit of foreign priority of Japanese patent application No. 2018-082536 filed on Apr. 23, 2018, the contents all of which are incorporated herein by reference.

TECHNICAL FIELD

The present invention relates to a back-up power supply system for a data center where a plurality of battery modules are used, and a back-up battery rack in the data center.

BACKGROUND ART

Typically, a data center uses a back-up power supply system using a secondary battery (e.g., lead battery) as a countermeasure for power source trouble, so as to maintain the power source for several minutes until a generator (e.g., diesel generator) starts up at an event of power failure. The back-up power supply system using the secondary battery is configured to back up power for an entire facility of the data center including air conditioning, lighting, and the like, and is effective when a commercial power source stops. This back-up battery normally has an output voltage set to approximately DC 100 V to 1000 V, and the output voltage is determined in accordance with a scale of each data center.

A lead battery normally has a service life of one to three years. When the lead battery is used as the back-up battery, in addition to a cost of the lead battery, each of replacement and recycling of the lead battery is highly costly. Additionally, a cost of fuel for the diesel generator is required, and the cost related to the back-up power source causes a significant burden on a manager of the data center. Further, in a case where power failure of the commercial power source occurs during replacement of the lead battery for maintenance or other reasons, the back-up power source may not fully function.

In recent years, due to a spread of fintech or e-commerce, reliability (availability) is more strongly required of each data center. In view of this, as a protection for data stored in a server at the event of power source trouble in each of server racks, it is proposed to mount the secondary battery in each of the server racks (in addition to the back-up power source for the entire facility of the data center), so as to individually back up the power source in the corresponding server rack. As a back-up battery for each of the server racks, a lithium ion battery is effective in saving location space.

As a preparation for power source trouble or power failure, each of which rarely occurs, the back-up battery basically needs to be maintained in a state of fully charged. Thus, the back-up battery is prone to degrade in characteristics such as full charge voltage, and even in the case of lithium ion battery, a replacement is required within three to five years. As has been described, disposal of the back-up battery causes the burden in terms of work and cost.

Under the circumstances described above, in recent years, a secondary battery that has been used in an environment is more frequently reused in another environment. For example, the secondary battery (module) used to back up the power source at the data center or others has deteriorated in power retention characteristics (voltage and capacity), but often still has a margin in amount of instantaneous output current or charge/discharge cycle. Accordingly, the secondary battery life-cycle cost, such as cost of the battery replacement, is reduced by reusing the secondary battery (that has been used) in another environment.

PTL 1 relates to reuse or rebuilding of a battery pack including a plurality of stacks, the battery pack mounted on a vehicle or the like, and discloses a technique where the reuse or rebuilding is determined based on a battery state (e.g., full charge capacity or internal resistance) of each of the stacks or cells. PTL 2 relates to reuse of an assembled battery mounted on a vehicle, and discloses a technique where, in scrapping the vehicle or in replacing the assembled battery with a new assembled battery, the assembled battery that has been used is collected to be disassembled in each battery module and is determined whether or not to be reused based on a result of measuring battery characteristics of the assembled battery. PTL 3 discloses that a power storage device connected in series is controlled based on depth of charge/discharge that is determined in accordance with a state, a usage period, or the like of the battery.

CITATION LIST

Patent Literature

PTL 1: WO 2011/162014 A
PTL 2: Unexamined Japanese Patent Publication No. 2011-216329
PTL 3: Unexamined Japanese Patent Publication No. 2003-244854

SUMMARY OF THE INVENTION

Secondary usage of a secondary battery that has completed a primary usage requires cost, and the cost is hardly ignored in consideration of a residual value (e.g., charge capacity, degree of degradation, charge cycle, or amount of discharge current) of the secondary battery that has completed the primary usage. The secondary battery that has completed the primary usage is normally collected and disassembled to be repacked in accordance with specifications in a location where the secondary battery is to be used next. Then, the secondary battery is delivered to be relocated in the location for secondary usage. In reuse of the secondary battery, each cost, such as a cost for the collection, a cost for the disassembly and repacking, a cost for the transportation, and a cost for the relocation, causes a significant burden. Further, the secondary battery provided for the secondary usage has a limited period of remaining service life and is prone to require frequent replacement.

In quite a few cases, each secondary battery for secondary usage is considered not to have the residual value that meets these series of costs. In the first place, it is difficult to evaluate the residual value of the secondary battery for the secondary usage, and it is thus difficult to clearly state the residual value of the secondary battery. Further, with the secondary battery for the secondary usage, the remaining service life is to vary in accordance with the next usage method. Thus, it is also difficult to identify a period of availability for the reuse.

In view of the respects described above, an object of the present invention is to provide a technique to reuse the secondary battery included in a data center at lower cost.

In order to achieve the object, an aspect of the present invention provides a back-up power supply system for a data center. The back-up power supply system includes: a server rack that is located in the data center and includes a server and at least one battery module for supplying an emergency power source to the server; a back-up battery rack that is located in the data center and includes a plurality of battery modules for supplying an emergency power source to other devices than the server; and a monitoring device configured to monitor a battery characteristic of each of the battery modules. The plurality of battery modules included in the back-up battery rack correspond to a plurality of the battery modules, each of which has completed a primary usage as the emergency power source in the server rack. Based on a specification required for the back-up battery rack and a history characteristic of each of the battery modules that has completed the primary usage in the server rack, the monitoring device determines a system configuration of the plurality of battery modules in the back-up battery rack.

Note that, any combinations of configuration elements above and translation of descriptions of the present invention in methods, devices, systems, and others are encompassed within an aspect of the present invention.

With the technique according to the present invention, it is possible to reuse a secondary battery included in a data center at lower cost.

DESCRIPTION OF EMBODIMENT

Figure 1:
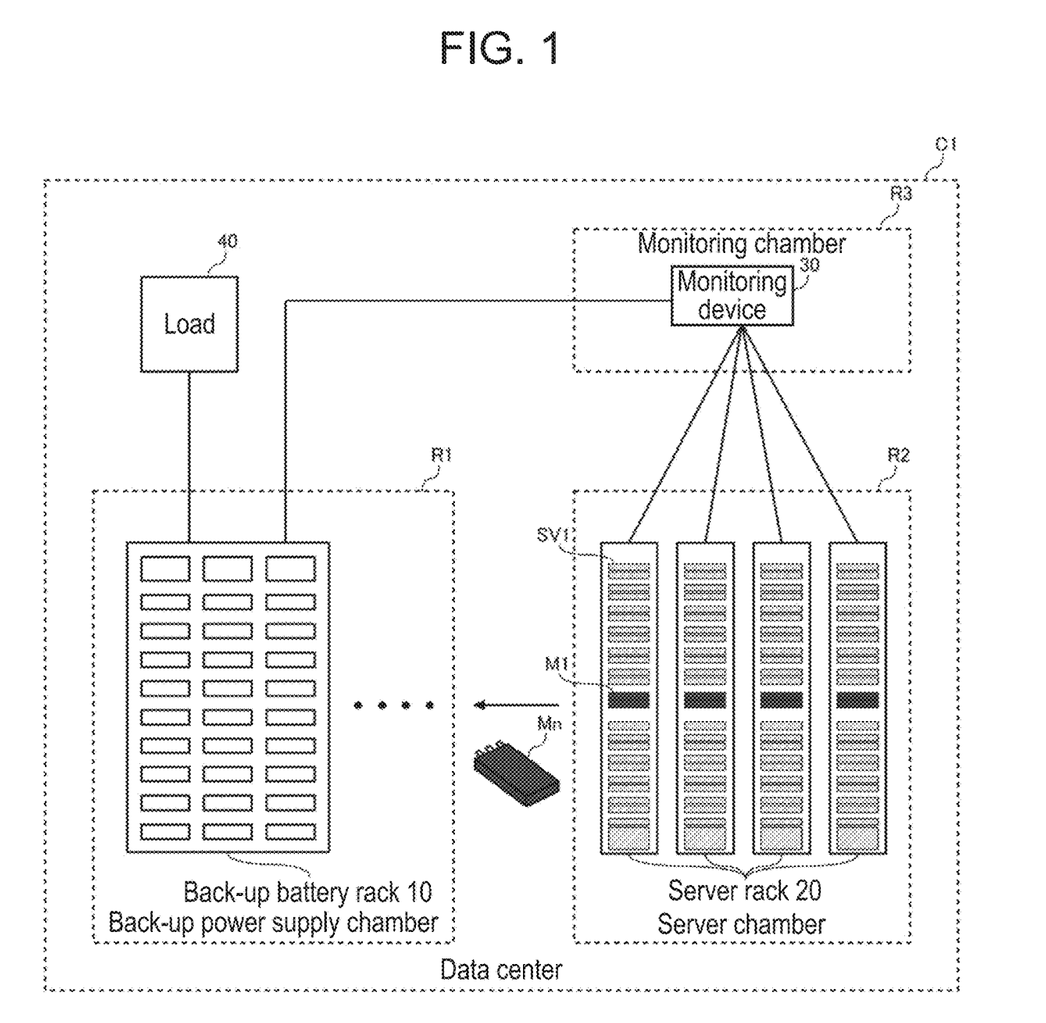
FIG. 1 is a diagram showing an overall configuration of a back-up power supply system in data center C according to an exemplary embodiment of the present invention.

FIG. 1 is a diagram showing an overall configuration of a back-up power supply system in data center C1 according to an exemplary embodiment of the present invention. Data center C1 in FIG. 1 includes back-up power supply chamber R1, server chamber R2, and monitoring chamber R3. Server chamber R2 includes a plurality of server racks 20. Each of the plurality of server racks 20 stores a plurality of servers SV1 and at least one battery module M1. Note that, in FIG. 1, only one of the servers/battery modules is denoted with a reference mark for simplification purposes. Each of server racks 20 stores the battery modules and the servers. Each of the battery modules is configured to supply an emergency power source solely to each of the servers in a corresponding one of server racks 20. Basically, each of the battery modules is not configured to supply the power source to a load outside server racks 20.

Back-up power supply chamber R1 includes a plurality of back-up battery racks 10. Each of the plurality of back-up battery racks 10 stores a plurality of battery modules. Each of the plurality of back-up battery racks 10 is a back-up power source to supply an emergency power source to an entire part of load 40 in data center C1. Load 40 in data center C1 includes, for example, an air conditioner or a lighting device. Note that, in this exemplary embodiment, each of back-up battery racks 10 is assumed not to be the back-up power source for each of servers SV1 in server racks 20. Note that, each of back-up battery racks 10 is assumed to be the back-up power source for monitoring device 30 in monitoring chamber R3.

Each of the battery modules used in back-up battery rack 10 is battery module Mn (where n is any natural number) that has completed a primary usage as a back-up battery for server racks 20. Note that, at an initial stage of an operation in data center C1, used is a battery module as a new product or a battery module that has completed the primary usage in other locations than data center C1.

Monitoring device 30 in monitoring chamber R3 is configured to monitor a state and characteristics of each of the battery modules included in each of server racks 20 of server chamber R2 and included in each of back-up battery racks 10 of back-up power supply chamber R1.

Figure 2:
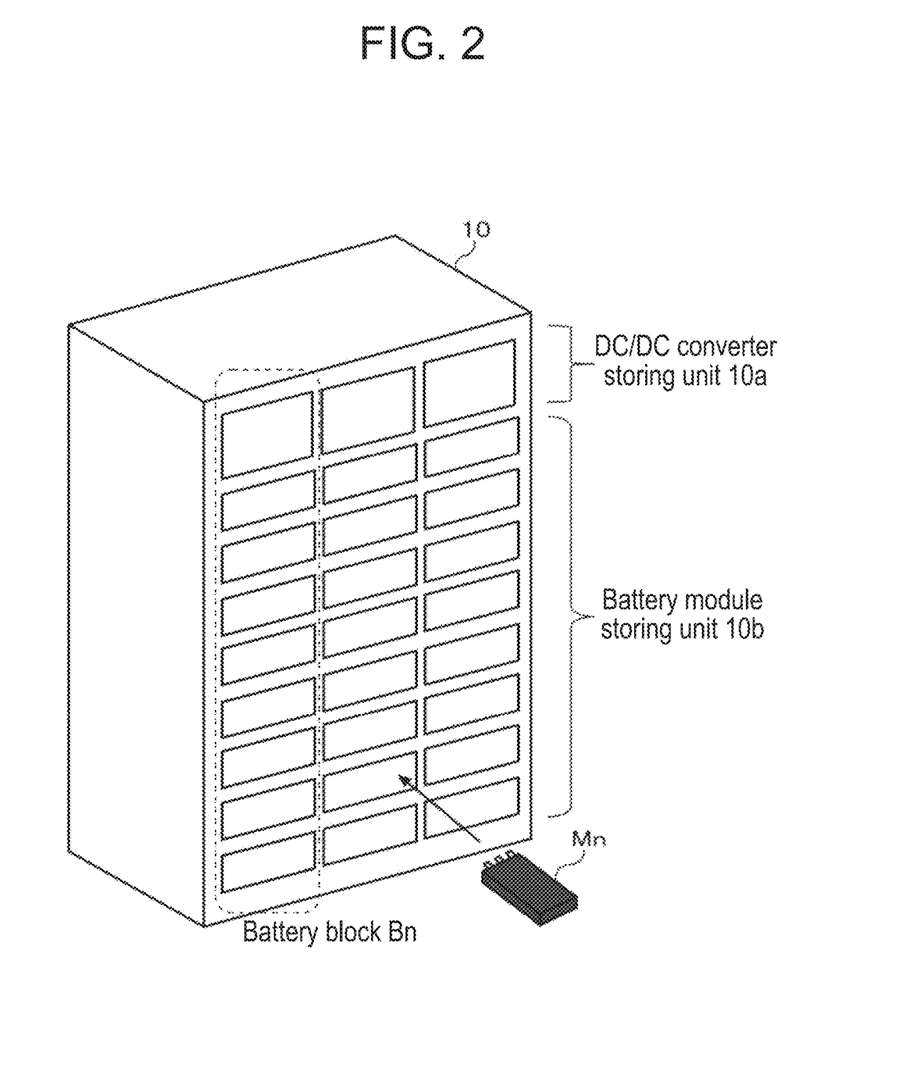
FIG. 2 is a diagram illustrating an example of an external configuration of a back-up battery rack.

FIG. 2 is a diagram illustrating an example of an external configuration of back-up battery rack 10. Back-up battery rack 10 includes a plurality of accommodating spaces formed in a matrix. Each of the plurality of accommodating spaces is configured to accommodate battery module Mn or a DC/DC converter (Direct current-direct current converter). In the example of FIG. 2, the DC/DC converter is stored in DC/DC converter storing unit 10a at a top stage of the plurality of accommodating spaces, and battery module Mn is stored in battery module storing unit 10b at each of the other stages than the top stage. A plurality of the DC/DC converters stored at the top stage are connected to a power supply source via a shared DC bus.

In the example of FIG. 2, each one of battery blocks Bn corresponds to a longitudinal row of the accommodating spaces. Each one of battery blocks Bn includes one DC/DC converter and a plurality of battery modules connected in series. The DC/DC converter controls charge/discharge of each of the plurality of battery modules.

Each one of battery blocks Bn has a power line (e.g., bus bar) and a communication line, each provided longitudinally on a rear face of back-up battery rack 10. Each of the accommodating spaces has, at its end, a terminal to connect with the power line and the communication line. This configuration allows an operator to mount battery module Mn in each of the accommodating spaces in order to connect a terminal of battery module Mn to the terminal in the corresponding accommodating space. As a result, battery module Mn is electrically connected to a corresponding one of battery blocks Bn.

In this state, battery module Mn is removable from back-up battery rack 10, and a number of series connections is adjustable in each one of battery blocks Bn. The plurality of battery modules stored in back-up battery rack 10 are connected in a series and parallel configuration that is determined to satisfy a required specification (e.g., voltage, current, power, capacity, or discharge output characteristics) in accordance with a scale of data center C1. A number of parallel connections may be adjusted based on a number of battery blocks, or may be adjusted by modifying a connection configuration within one of the battery blocks to the series and parallel configuration.

Figure 3:
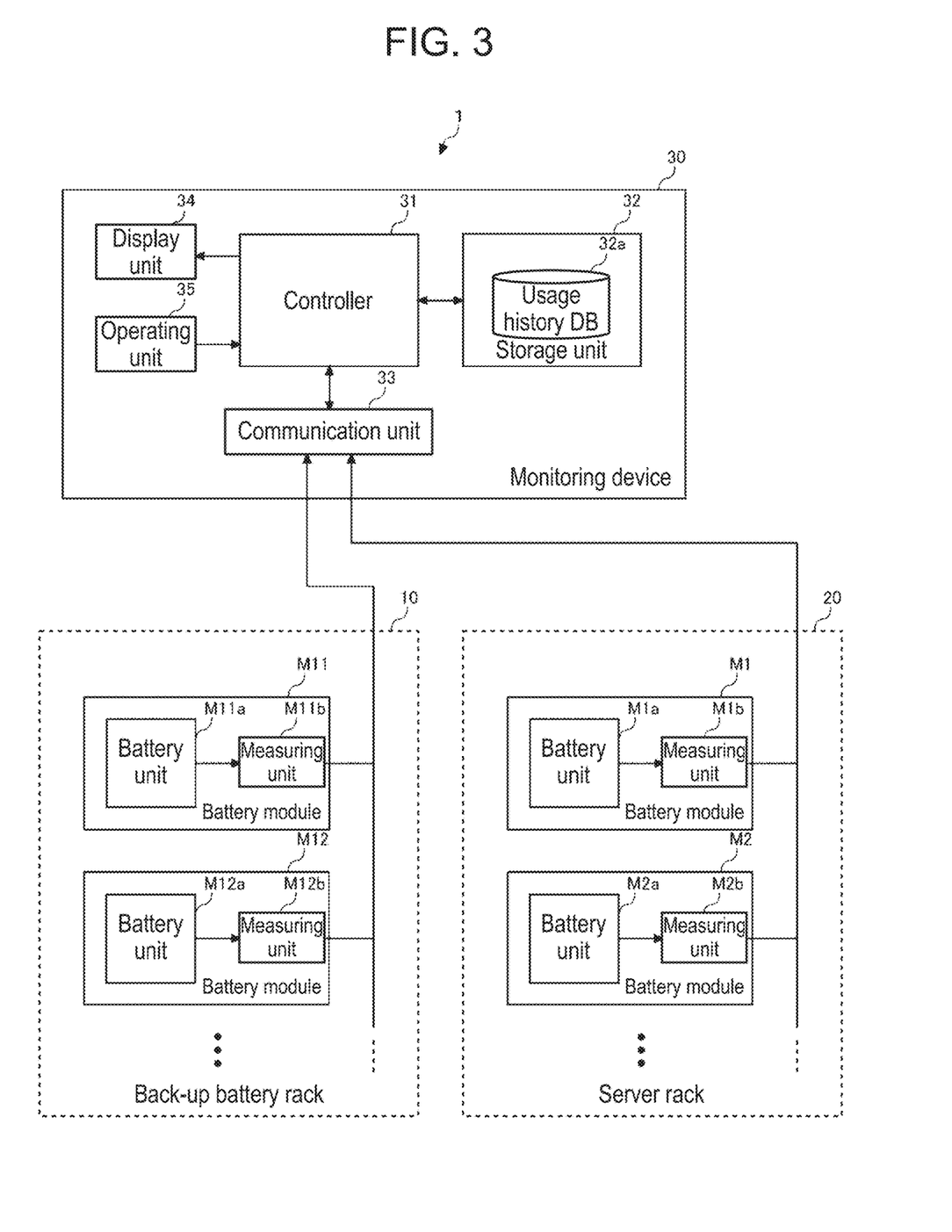
FIG. 3 is a diagram showing a functional block of the back-up power supply system for the data center according to the exemplary embodiment of the present invention.

FIG. 3 is a diagram showing a functional block of back-up power supply system 1 in data center C1 according to the exemplary embodiment of the present invention. In FIG. 3, each of back-up battery rack 10 and server rack 20 includes battery module Mn only, and other configuration elements are omitted. Note that, a detail configuration of back-up battery rack 10 will be described later with reference to FIG. 4.

Each battery module Mn includes battery unit Mna and measuring unit Mnb. Battery unit Mna includes a plurality of cells that are connected in series or in series and parallel. Each of the cells may be a lithium ion battery cell, a nickel metal hydride battery cell, a lead battery cell, or the like. In this exemplary embodiment below, each of the cells is assumed to be the lithium ion battery cell. Measuring unit Mnb detects a voltage, a current, and a temperature of each of a plurality of cells. Then, measuring unit Mnb transmits the voltage, the current, and the temperature of the corresponding cell that measuring unit Mnb has detected to monitoring device 30 via the communication line. Measuring unit Mnb of each battery module Mn may communicate with monitoring device 30 by using RS-485 protocol, TCP/IP protocol, CAN protocol, or others.

Monitoring device 30 includes controller 31, storage unit 32, communication unit 33, display unit 34, and operating unit 35. Monitoring device 30 employs at least one server or one personal computer (PC). Controller 31 is achieved by collaboration of a hardware resource and a software resource. The hardware resource may be a central processing unit (CPU), a graphics processing unit (GPU), a digital signal processing (DSP), a field-programmable gate array (FPGA), or other large scale integration (LSI) devices. The software resource may be a program such as an operating system or an application.

Storage unit 32 includes usage history database 32a. Storage unit 32 includes a large capacity non-volatile memory such as a hard disk drive (HDD) or a solid state drive (SSD). Communication unit 33 executes a communication process based on a predetermined communication standard. Communication unit 33 receives monitoring data transmitted from measuring unit Mnb of each battery module Mn. Then, communication unit 33 outputs the monitoring data to controller 31. Based on the monitoring data received from communication unit 33, controller 31 stores usage history data of each battery module Mn into usage history database 32a.

Display unit 34 includes a liquid crystal display, an organic electroluminescence (EL) display, or the like. Display unit 34 displays, on its screen, information supplied by controller 31. Operating unit 35 includes a keyboard, a mouse, a touch panel, and others. Operating unit 35 converts a physical operation by the operator to an electric signal, and outputs the electric signal to controller 31.

Figure 4:
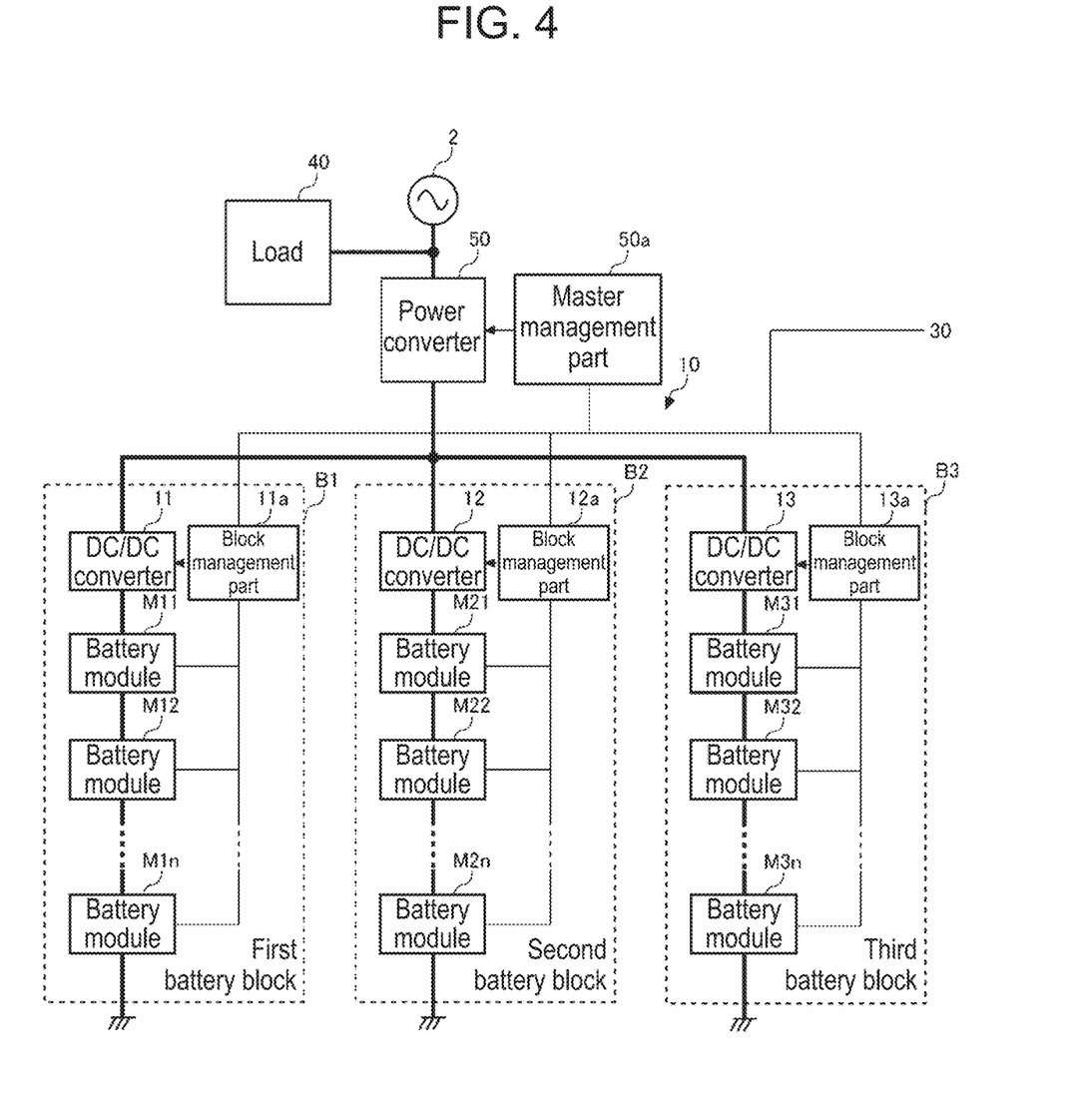
FIG. 4 is a diagram showing an example of a circuit configuration in the back-up battery rack according to the exemplary embodiment of the present invention.

FIG. 4 is a diagram showing an example of a circuit configuration in back-up battery rack 10 according to the exemplary embodiment of the present invention. In the example of FIG. 4, back-up battery rack 10 includes three battery blocks, i.e., first battery block B1, second battery block B2, and third battery block B3.

First battery block B1 includes first DC/DC converter 11, a plurality of battery modules M11 to M1n that are connected in series, and first block management part 11a. Second battery block B2 includes second DC/DC converter 12, a plurality of battery modules M21 to M2n that are connected in series, and second block management part 12a. Third battery block B3 includes third DC/DC converter 13, a plurality of battery modules M31 to M3n that are connected in series, and third block management part 13a.

Each of first DC/DC converter 11, second DC/DC converter 12, and third DC/DC converter 13 is connected in parallel to power converter 50. Power converter 50 may be a typical power conditioner and includes a bidirectional inverter. Each of a plurality of battery blocks B1, B2, and B3 discharges DC power, and power converter 50 converts the DC power to AC power. Power converter 50 outputs the AC power to load 40 or commercial power system 2 in the facility as a back-up object of power converter 50. Further, power converter 50 converts AC power input by commercial power system 2 to DC power, and uses the DC power to charge the plurality of battery blocks B1, B2, and B3 connected in parallel. Note that, power converter 50 may be mounted in back-up battery rack 10.

Each of first block management part 11a, second block management part 12, third block management part 13a, and master management part 50a is achieved by collaboration of a hardware resource and a software resource. The hardware resource may be a micro-computer, the DSP, the FPGA, or other LSI devices. The software resource may be a program such as firmware. Note that, instead of master management part 50a, any one of first block management part 11a, second block management part 12a, and third block management part 13a may concurrently function as a master management part.

In first battery block B1, the measuring unit in each of battery modules M11 to M1n detects the voltage, the current, and the temperature of each of the plurality of cells in a corresponding one of battery modules M11 to M1n. Then, the measuring unit transmits the voltage, the current, and the temperature of the corresponding cell detected to first block management part 11a via the communication line. Based on the voltage, the current, and the temperature of the corresponding cell received, first block management part 11a estimates a state of charge (SOC) and a state of health (SOH) in the corresponding cell.

The SOC may be estimated based on an open circuit voltage (OCV) method or a current integration method. In the OCV method, the SOC is estimated based on the OCV of each of the cells that the measuring unit measures, and based on characteristics data of an SOC/OCV curve that is previously held. In the current integration method, the SOC is estimated based on the OCV of each of the cells that the measuring unit measures at start of charge/discharge of the corresponding cell, and based on an integrated value of the current that the measuring unit measures.

The SOH is specified based on a ratio of a current full charge capacity to an initial full charge capacity in each of the cells. When the ratio is lower, the corresponding cell has degraded. Degradation of a secondary battery may be approximated by a sum of storage degradation and cycle degradation. The storage degradation corresponds to degradation progressing over time in accordance with each of the temperature and the SOC of the secondary battery at each time point, regardless of whether the secondary battery is in charge or in discharge. When the SOC at each time point is higher (closer to 100%) or when the temperature at each time point is higher, the storage degradation progresses more significantly. The cycle degradation corresponds to degradation that progresses in accordance with an increase in frequency of charge/discharge. The cycle degradation depends on a range of SOC usage, the temperature, and a current rate. When the range of SOC usage is larger, when the temperature is higher, or when the current rate is higher, the cycle degradation progresses more significantly.

First block management part 11a receives the voltage, the current, and the temperature of each of the cells from the measuring unit in each of battery modules M11 to M1n. Then, first block management part 11a transmits the voltage, the current, and the temperature to monitoring device 30 via the communication line. Note that, first block management part 11a may transfer data received from the measuring unit straight to monitoring device 30, or may summarize or aggregate the data before transmitting the data to monitoring device 30. Alternatively, first block management part 11a may transmit data collected only when the corresponding cell discharges as the emergency power source. Concurrently, first block management part 11a receives various commands from monitoring device 30. Based on the state of each of battery modules M11 to M1n in first battery block B1 together with the various commands from monitoring device 30, first block management part 11a controls charge/discharge of first DC/DC converter 11.

Further, when abnormality occurs in any one of the cells in first battery block B1, first block management part 11a transmits abnormality occurrence notification to master management part 50a, the other block management parts (i.e., second block management part 12a and third block management part 13a), and monitoring device 30.

Each of second block management part 12a and third block management part 13a has a same operation as first block management part 11a, and thus a detailed description thereof will be omitted.

Master management part 50a controls power converter 50 based on the command from monitoring device 30. Note that, when power converter 50 is in operation and when master management part 50a receives the abnormality occurrence notification from any one of first block management part 11a, second block management part 12a, and third block management part 13a, master management part 50a is configured to stop the operation of power converter 50. When the range of SOC usage is set smaller or when power capacity has a margin such as a case where the configuration includes a spare battery block, monitoring device 30 commands the block management part that has transmitted the abnormality occurrence notification to stop the charge or the discharge of the battery block where the abnormality has occurred. With regard to a decrease in the power capacity caused by the stop of the charge or the discharge, monitoring device 30 commands the other block management parts (including a block management part in the spare battery block) to cover for the decrease by the margin. In some cases, monitoring device 30 commands master management part 50a to continue the operation of power converter 50, and based on the command from monitoring device 30, master management part 50a continues the operation of power converter 50. Further, in some cases, when commanding the block management part that has transmitted the abnormality occurrence notification to stop the charge or the discharge of the battery block where the abnormality has occurred, monitoring device 30 concurrently commands master management part 50a to decrease an input or an output by an amount of the decrease in the power capacity caused by the stop. Then, based on the command from monitoring device 30, master management part 50a continues the operation of power converter 50.

While an example of a circuit configuration in server rack 20 is not shown, the plurality of battery modules stored in server rack 20 are designed to be connected in a configuration that satisfies a required specification of each of the servers in server rack 20. Server rack 20 stores an inverter and a management unit. The inverter converts the AC power supplied by commercial power system 2 to DC power, and uses the DC power to charge the plurality of battery modules in server rack 20. The plurality of battery modules discharges the DC power. The inverter converts the DC power to AC power and outputs the AC power to each of the servers as a back-up object of the inverter.

In server rack 20, a measuring unit in each of the battery modules measures a voltage, a current, and a temperature of each of cells in the corresponding battery module; and the management unit receives the voltage, the current, and the temperature of the corresponding cell from the measuring unit. The management unit transmits the voltage, the current, and the temperature of the corresponding cell received from the measuring unit to monitoring device 30 via the communication line. Note that, the management unit may transfer data received from the measuring unit straight to monitoring device 30, or may summarize or aggregate the data before transmitting the data to monitoring device 30. Alternatively, first block management part 11a may transmit data collected only when the corresponding cell discharges as the emergency power source. Concurrently, the management unit receives various commands from monitoring device 30. Based on the state of each of the battery modules in server rack 20 together with the various commands from monitoring device 30, the management unit controls the inverter.

Figure 5:
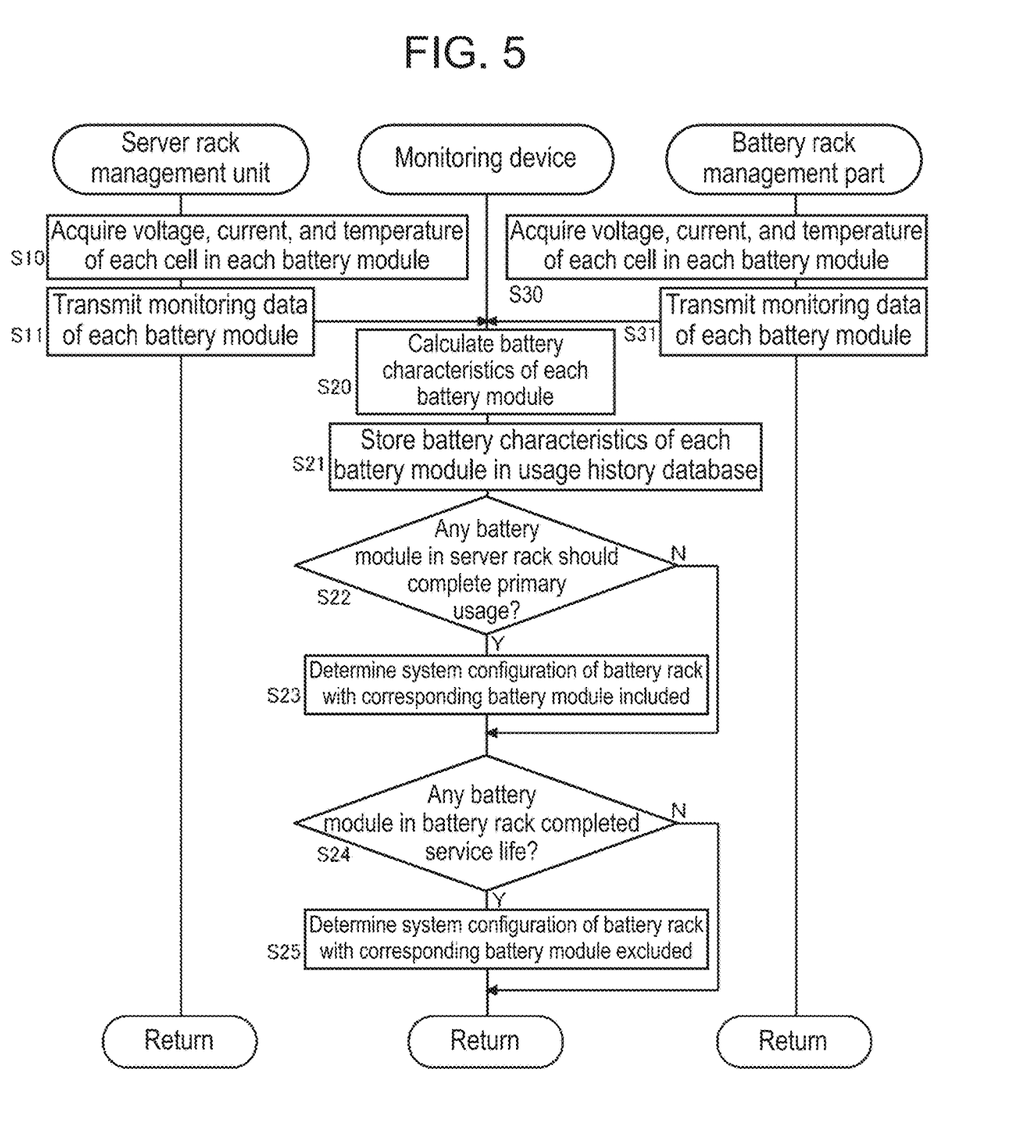
FIG. 5 is a flowchart showing a basic operation of the back-up power supply system according to the exemplary embodiment of the present invention.

FIG. 5 is a flowchart showing a basic operation of back-up power supply system 1 according to the exemplary embodiment of the present invention. In server rack 20, the management unit acquires the voltage, the current, and the temperature of each of the cells from the measuring unit in each of the battery modules (S10). The management unit transmits the voltage, the current, and the temperature of each of the cells to monitoring device 30 as monitoring data for the corresponding battery module (S11). The monitoring data may include the SOC and/or the SOH of each of the cells calculated by the management unit.

In back-up battery rack 10, a plurality of block management parts 11a, 12a, and 13a respectively acquire the voltage, the current, and the temperature of each of the cells in each of the battery modules in battery blocks B1, B2, and B3, from the measuring unit in the corresponding battery module (S30). Each of the plurality of block management parts 11a, 12a, and 13a transmits the voltage, the current, and the temperature of each of the cells in each of the battery modules to monitoring device 30 as the monitoring data for the corresponding battery module (S31).

In monitoring device 30, based on the monitoring data received from the management unit in server rack 20 and the monitoring data from each of the plurality of block management parts 11a, 12a, and 13a in back-up battery rack 10, controller 31 calculates battery characteristics of each of the battery modules (S20). Controller 31 calculates, for example, the SOC, the internal resistance, the SOH, an amount of discharge current, a drop voltage with respect to the amount of discharge current, or others of the corresponding battery module. These battery characteristics may be calculated based on the voltage in times series, the current in time series, and the temperature at each time point. Controller 31 records the battery characteristics of the corresponding battery module in usage history database 32a (S21).

Controller 31 in monitoring device 30 determines whether or not any one of the battery modules in server rack 20 should complete the primary usage (S22). For example, controller 31 selects the battery module showing the SOH decreased to a predetermined value (e.g., 60%) as the battery module that is no longer appropriate to be used as the back-up battery in server rack 20 and thus should complete the primary usage. When any one of the battery modules should complete the primary usage (Y in S22), controller 31 determines a system configuration of back-up battery rack 10 in a state where the battery module that has completed the primary usage is included (S23).

Figure 6:
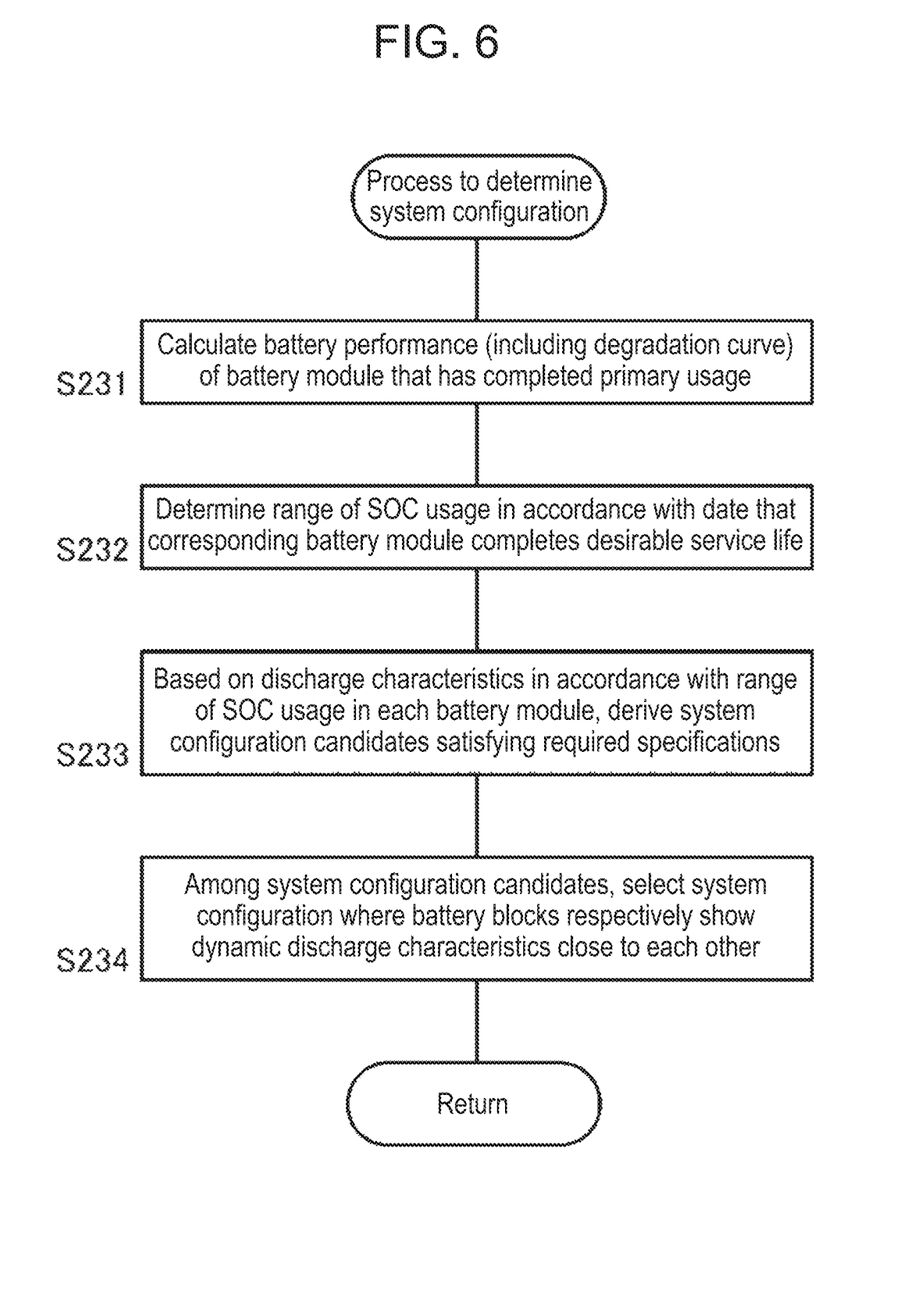
FIG. 6 is a subroutine flowchart showing an example of a process for determining a system configuration in step S23 of the flowchart in FIG. 5.

FIG. 6 is a subroutine flowchart showing an example of a process for determining the system configuration in step S23 of the flowchart in FIG. 5. Controller 31 in monitoring device 30 identifies a state of the battery module that has completed the primary usage, and calculates battery performance of the battery module that has completed the primary usage (S231). Controller 31, for example, estimates a degradation curve of the battery module that has completed the primary usage. In this state, controller 31 estimates a plurality of patterns of the degradation curves in a case where the battery module has been used in a plurality of different charge/discharge control patterns. With this configuration, it is possible to predict a service life in each of the charge/discharge control patterns. When the range of SOC usage is smaller, the secondary battery degrades less. Thus, in order to extend the service life of the battery module that has completed the primary usage, the range of SOC usage (depth of discharge) may be set smaller.

Controller 31 also estimates each of charge characteristics and discharge characteristics of the battery module that has completed the primary usage. As the degradation progresses, the secondary battery shows a charge curve and a discharge curve, on each of which a flat area with a small change in voltage decreases. Each of the battery modules reused varies in the charge characteristics and the discharge characteristics. Further, each of the battery modules reused varies in dynamic charge characteristics during charge of constant current (CC), and varies in dynamic discharge characteristics during discharge of the CC. With a battery module as a new product, during charge of CC or at discharge of the CC, an SOC of the battery module basically increases or decreases linearly. On the other hand, each of the battery modules reused shows the SOC increasing or decreasing in various curves. In other words, each of the battery modules reused shows an output voltage that fluctuates irregularly at each moment in accordance with the deterioration state.

Based on the battery performance (mainly degradation curve) of the battery module that has completed the primary usage and is to be included in back-up battery rack 10, controller 31 determines the range of SOC usage (depth of discharge) in accordance with a date that a desirable service life is to complete (S232). The date that the desirable service life is to complete may, for example, be set to a date that any one of other battery modules in back-up battery rack 10 is expected to complete the service life.

Based on the discharge characteristics in accordance with the range of SOC usage in each of the battery module (that has completed the primary usage and is to be included in back-up battery rack 10) and the other battery modules stored in back-up battery rack 10, controller 31 derives system configuration candidates for a battery module that satisfies the required specification (S233). When the range of SOC usage is set smaller (e.g., 30% to 70%), the discharge current needs to be significantly decreased in response to the decrease in SOC. Accordingly, in a battery block including the battery module where the range of SOC usage is set smaller, a number of battery modules needs to be increased to give margin to power capacity, so that the battery block has the power capacity required as a back-up power source.

On the other hand, when the range of SOC usage is set larger (e.g., 10% to 90%), the decrease in discharge current in response to the decrease in SOC is kept small. Accordingly, in a battery block including a battery module where the range of SOC usage is set larger, it is possible to decrease the margin in power capacity and thus to decrease the number of battery modules. However, when the range of SOC usage is set larger as described above, the battery module has shorter service life.

Among the system configuration candidates for the battery module that controller 31 has derived, controller 31 selects a system configuration where battery blocks B1, B2, and B3 respectively show the dynamic discharge characteristics close to each other. (S234). As has been described above, each of the battery modules reused varies in the characteristics. Each of the battery modules reused varies in output voltage, and varies in time-series change of the output voltage during discharge. Further, each of the battery modules reused varies in the output voltage at each SOC. Accordingly, when back-up battery rack 10 supplies the emergency power source to the load 40 in the facility, DC/DC converters 11, 12, and 13 are required to respectively have the output voltages in battery blocks B1, B2, and B3 matching each other. In some of battery blocks B1 to B3, each of the DC/DC converters needs to boost the output voltage; while in the others of battery blocks B1 to B3, each of the DC/DC converters does not need to boost the output voltage.

Figure 7:
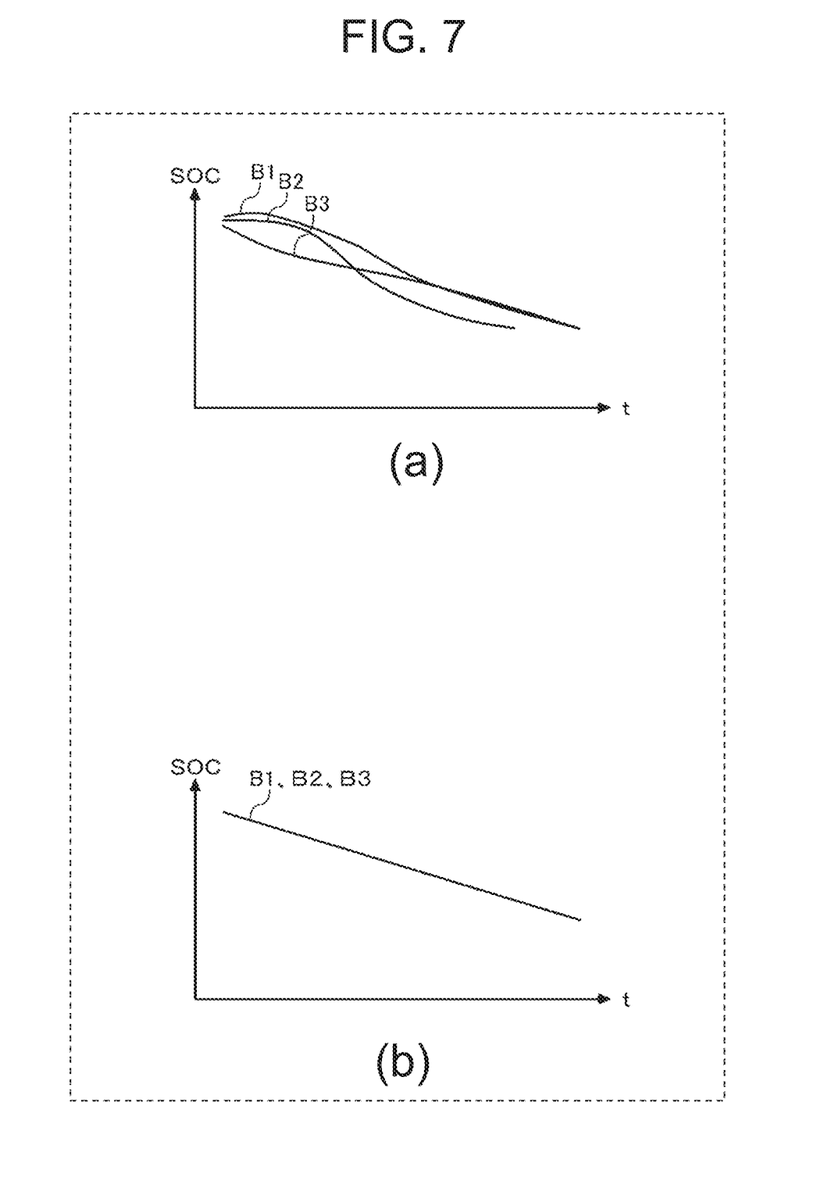
FIG. 7 is a diagram showing dynamic characteristics of a state of charge (SOC) in each of a plurality of battery blocks during discharge of constant current.

FIG. 7 is a diagram showing dynamic characteristics of the SOC in each of the plurality of battery blocks B1 to B3 during discharge of the constant current. Part (a) of FIG. 7 is the diagram showing an example of the dynamic characteristics of the SOC when each of the plurality of battery blocks B1 to B3 includes the battery module reused. In order to have the output voltages in the plurality of battery blocks B1 to B3 matching each other, each of DC/DC converters 11 to 13 in battery blocks B1 to B3 adaptively adjusts a duty ratio and/or a frequency of each of the output voltages by feedback control. As a result, the output voltage in each of battery blocks B1 to B3 matches a shared target voltage. Part (b) of FIG. 7 is the diagram showing the dynamic characteristics of the SOC in each of battery blocks B1 to B3 when the output voltage in each of battery blocks B1 to B3 is ideally adjusted by DC/DC converters 11 to 13 in battery blocks B1 to B3.

On the assumption described above, in step S234, controller 31 of monitoring device 30 determines a combination of the battery modules, each of which is to be adopted in each of battery blocks B1 to B3, and determines the connection configuration of these battery modules. As a result, battery blocks B1 to B3 respectively show the dynamic characteristics of the SOCs closest to each other. In other words, controller 31 determines the combination where, in a total of the voltages of the plurality of battery modules in each of battery blocks B1 to B3 (i.e., the output voltage of each of battery blocks B1 to B3), each of battery blocks B1 to B2 stably shows the voltage closest to the shared target voltage. For example, in any one of the battery blocks where a battery module shows the output voltage lower than the shared target voltage, a battery module showing the output voltage higher than the shared target voltage is to be included. As a result, the output voltage in the corresponding battery block is closer to the shared target voltage.

In step S234, it is possible to form a most efficient system by selecting the system configuration where battery blocks B1 to B3 respectively show the dynamic characteristics of the SOCs closest to each other.

Each of DC/DC converters 11 to 13 in battery blocks B1 to B3 decreases an upper limit value (limiter value) of an output current during discharge, in accordance with the range of SOC usage in each of battery blocks B1 to B3. In other words, in a state where the output voltage is constant, each of DC/DC converters 11 to 13 decreases the upper limit value of the output current in accordance with the decrease in SOC. When the range of SOC usage is smaller, a gradient of the decrease in upper limit value of the output current is set to a sharper angle.

In the system configuration selected in step S234, the plurality of battery blocks B1 to B3 connected in parallel to each other are required to show a total of the discharge current that satisfies the required specification, even when any one of the battery blocks has the discharge current decreasing due to the restriction of the upper limit value of the output current. For example, as dischargeable capacity, each of battery blocks B1 to B3 preferably has the capacity including a margin that is more than or equal to 30% of the capacity required for the corresponding battery block.

Returning back to FIG. 5, the flowchart will be described. Based on the system configuration determined in step S23, the operator repacks back-up battery rack 10. In monitoring device 30, controller 31 determines whether or not any one of the battery modules has completed the service life in back-up battery rack 10 (S24). Note that, a threshold of the battery performance determined as the service life (e.g., SOH or internal resistance) may be a value recommended by a battery maker or a value determined by an operation manager in data center C1. When any one of the battery modules has completed the service life in back-up battery rack 10 (Y in S24), controller 31 determines the system configuration of back-up battery rack 10 in a state where the battery module that has completed the service life is excluded (S25). With regard to a method to determine the system configuration, the method may be the same as in the process for determining the system configuration in FIG. 6.

In the process for determining the system configuration in step S23, controller 31 of monitoring device 30 may, without changing an arrangement of the battery modules already stored in back-up battery rack 10, determine a storage position of each of the battery modules to be additionally included. In this case, based on the performance of each of the battery modules (to be additionally included) that has been calculated, controller 31 considers which one of the battery blocks in back-up battery rack 10 should include the corresponding battery module to maximize a total performance required in data center C1, before determining the storage position of the battery module. Note that, when the system configuration is entirely reformed including the arrangement of the battery modules already stored, the total performance is further improved.

The plurality of battery modules in server rack 20 may be simultaneously replaced with new ones at predetermined timing intervals. In that case, some of the plurality of battery modules that have completed the primary usages show different degrees of degradation from the others. For example, when battery module Ma and battery module Mb respectively show the different degrees of degradation from each other, and when battery module Mb shows a higher degree of degradation than battery module Ma, the battery block including battery module Mb is determined to have a greater number of series connections and/or parallel connections than the battery block including battery module Ma. In other words, when each of the battery blocks in back-up battery rack 10 is formed by including the battery module that has degraded to some degree, the greater number of series connections or the greater number of parallel connections is required to cover for a constant voltage and current. As has been described, when each of the battery modules forms the battery block, the number of series connections and the number of parallel connections in the corresponding module are determined in accordance with the degree of degradation. As a result, it is possible to package the corresponding battery module in accordance with a usage purpose in data center C1 or the scale of data center C1.

Further, as has been described above, based on specification conditions required in data center C1, monitoring device 30 considers whether or not to modify the method to control the charge/discharge of each of DC/DC converters 11 to 13 in back-up battery rack 10. For example, based on the degree of degradation, when any one of the battery modules is expected to complete the service life sooner than the service life planned in a case of being further used, the DC/DC converter related to the corresponding battery module is controlled to have the depth of charge/discharge smaller. With this configuration, it is possible to decrease the load on the battery module and thus to use the battery module for a longer period. In a case where the performance is more important than the service life, the depth of charge/discharge is controlled to be larger, so that more power is supplied. Accordingly, it is possible to use the battery module more flexibly by adjusting the depth of discharge. In other words, it is possible to appropriately select the usage method as follows: a usage method to prioritize the service life of the battery, or a usage method to prioritize an output performance of the battery.

As has been described, while considering the specification conditions required for the system, along with the state of each of the battery modules included in server rack 20 (e.g., charge capacity and internal resistance), monitoring device 30 determines the storage positions and the series/parallel connection configuration of the battery modules to be included in back-up battery rack 10 for the secondary usage. Here, each of the storage positions and the series/parallel connection configuration is determined in accordance with the battery performance of each of the battery modules to be included. By controlling the charge/discharge of each of DC/DC converters 11 to 13 in back-up battery rack 10 in accordance with the performance of each of the battery modules, it is possible to achieve the total performance required in the system. Further, monitoring device 30 constantly monitors the state of each of the battery modules that has been transferred into back-up battery rack 10. With this configuration, similarly to the battery modules in server rack 20, each of the battery modules in back-up battery rack 10 is ensured to operate to satisfy the specification conditions required for the entire part of the system, while maintaining target performance (e.g., power storage capacity, the amount of discharge current, and a period of operational years). For example, the connection configuration of the plurality of battery modules in back-up battery rack 10 is periodically modified in accordance with the state of each of the plurality of battery modules. With this configuration, the specification conditions required are continuously satisfied.

With regard to a process of transferring each of the battery modules from server rack 20 to back-up battery rack 10, the operator may undertake the process by following the command from monitoring device 30, or the process may be automatically carried out by a robot carrier or the like.

When the series and parallel configuration of the plurality of battery modules in back-up battery rack 10 has been determined, each of the battery modules is mounted in the storage location in back-up battery rack 10, sequentially from a bottom in each of the rows. In a case of a manual process, the operator mounts each of the battery modules in the battery block specified, sequentially from the bottom in each of the rows. With this sequence order, back-up battery rack 10 has a center of gravity placed low, so that back-up battery rack 10 is physically stabilized. With the battery blocks where the number of series connections of the battery modules are different from each other, the arrangement of the battery blocks in left-to-right direction is determined such that the center of gravity of back-up battery rack 10 is placed at a center in the left-to-right direction. As a result, back-up battery rack 10 is physically stabilized.

As has been described above, in this exemplary embodiment, in data center C1, each of the battery modules that has been used in server rack 20 is reused directly in back-up battery rack 10. With this configuration, it is possible to reduce cost normally generated in secondary usage of the battery modules such as collection, transportation, relocation, and repacking.

Each of the battery modules in back-up battery rack 10 has been monitored while used in server rack 20 in data center C1. Accordingly, each of the battery modules has the history of usage and deterioration state recorded, and thus, based on the combination of the battery modules, it is possible to easily predict a battery balance, the amount of discharge, future progress of the degradation, or others. With this configuration, it is possible to efficiently carry out the operation in accordance with the scale or requirements of each data center. Additionally, the series/parallel connection configuration of the battery modules may be freely modified and thus, it is possible to control the charge/discharge in accordance with the state of each of the battery modules. Here, it is possible to package each of the battery modules in accordance with the usage purpose in the location where the corresponding battery module is to be included for the secondary usage, and to flexibly fulfill the required specification.

Further, each one of the battery blocks includes the plurality of battery modules, and one DC/DC converter to which the plurality of battery modules are connected. With this configuration, when any one of the battery modules needs maintenance, monitoring device 30 stops the operation of the DC/DC converter only in the battery block including the corresponding battery module. It is thus possible to replace each of the battery modules without affecting the other battery blocks and without entirely stopping the operation of the system. Accordingly, an operational rate (operational availability) is improved.

The exemplary embodiment of the present invention has been described above. It is to be understood, for the person of ordinary skill in the art, that the foregoing exemplary embodiment is merely illustrative, and not restrictive; the respective configuration elements and processing processes described in the foregoing exemplary embodiment may be combined in modified examples, and any modified examples appropriately made within the spirit of the present invention will naturally fall within the scope of the present invention.

In the foregoing exemplary embodiment, the example where the DC/DC converter is not included in each battery module Mn has been described. In this respect, in some cases, battery module Mn includes a DC/DC converter.

Figure 8:
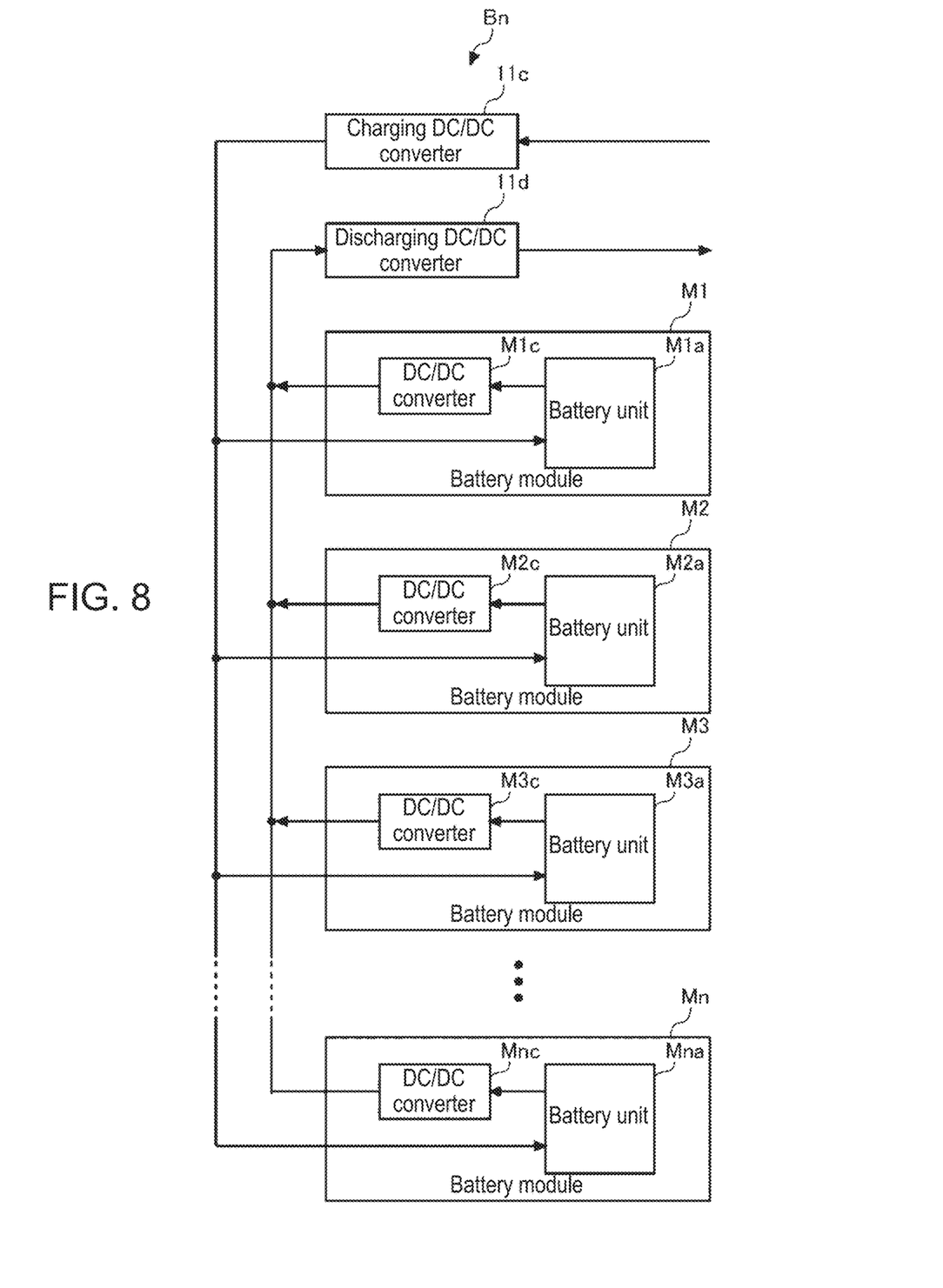
FIG. 8 is a diagram showing an example 1 of a configuration of a battery block according to a modified example.

FIG. 8 is a diagram showing an example 1 of a configuration of battery block Bn according to a modified example. Battery block Bn in FIG. 8 includes a plurality of battery modules M1 to Mn, charging DC/DC converter 11$c$, and discharging DC/DC converter 11$d$. Battery modules M1 to Mn respectively include battery units M1$a$ to Mn$a$ and DC/DC converters M1$c$ to Mn$c$. Note that, in FIG. 8, a measuring unit and a block management part in each of the battery modules are omitted for simplification purposes.

In battery block Bn of FIG. 8, a charging path and a discharging path are provided separately. Each of DC/DC converters M1$c$ to Mn$c$ in battery modules M1 to Mn is a DC/DC converter dedicated to discharge. Each of DC/DC converters M1$c$ to Mn$c$ individually controls a discharge voltage/discharge current of each of battery units M1$a$ to Mn$a$. Each of a plurality of DC/DC converters M1$c$ to Mn$c$ has an output connected to the discharging path of bus type, and the discharging path is connected to an input terminal of discharging DC/DC converter 11$d$. Charging DC/DC converter 11$c$ has an output connected to the charging path of a bus type; and each of a plurality of battery units M1$a$ to Mn$a$ has a charge terminal connected in parallel to the charging path of the bus type.

Figure 9:
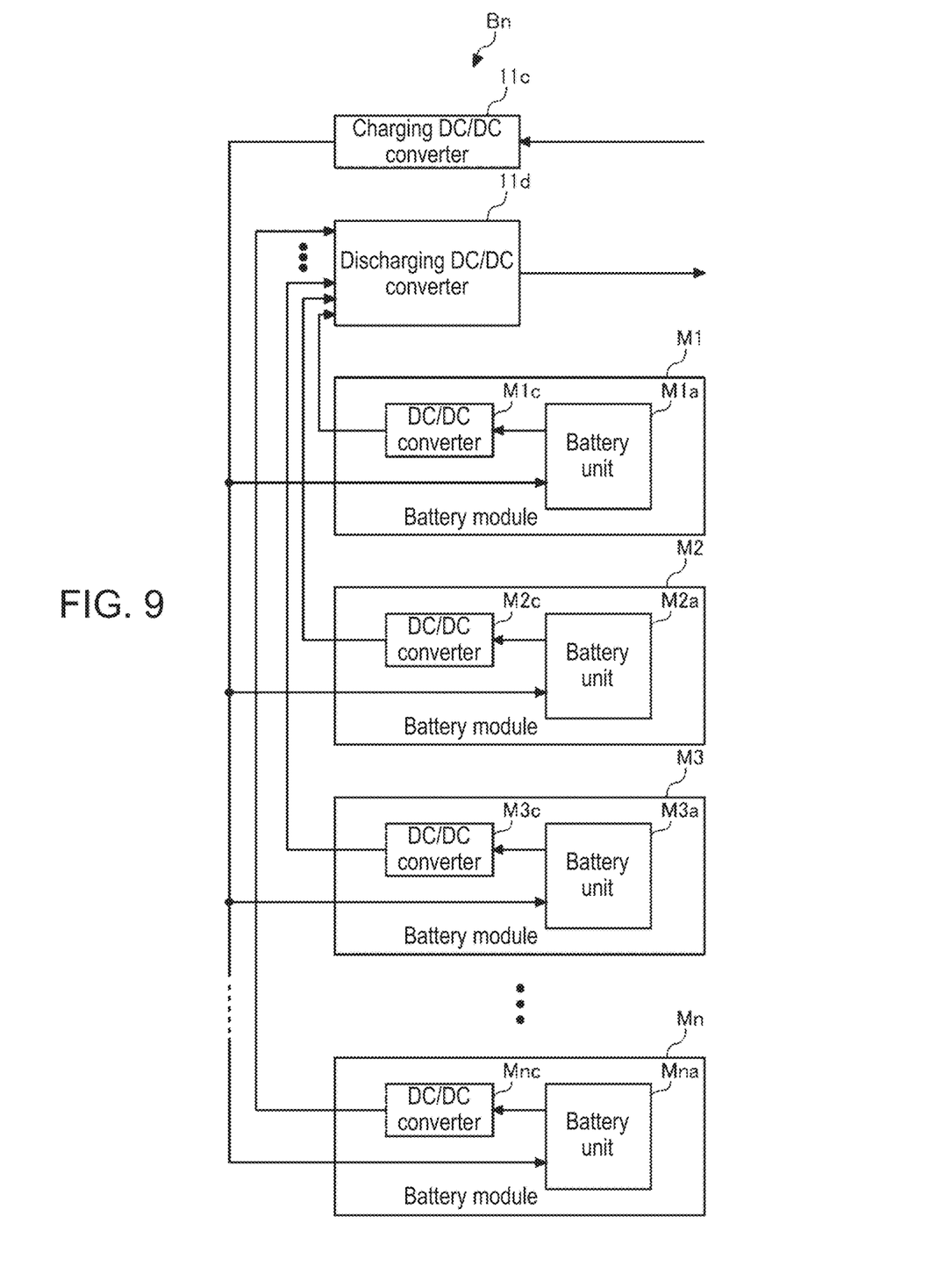
FIG. 9 is a diagram showing an example 2 of the configuration of the battery block according to the modified example.

FIG. 9 is a diagram showing an example 2 of the configuration of battery block Bn according to the modified example. In the example 2 of the configuration, each of DC/DC converters M1$c$ to Mn$c$ in battery modules M1 to Mn has an output terminal connected independently to the input terminal of discharging DC/DC converter 11$d$. With this star connection in discharging DC/DC converter 11$d$, it is possible to reduce a cross current flow between the plurality of DC/DC converters M1$c$ to Mn$c$, compared with the bus type connections as shown in FIG. 8.

Further, in the foregoing exemplary embodiment, the example where monitoring device 30 is located in monitoring chamber R3 in data center C1 has been described. In this respect, monitoring device 30 may be located remotely other than in data center C1. For example, monitoring device 30 may be located in a cloud server in another data center.

Still further, in the foregoing exemplary embodiment, the example, where the battery module has completed the primary usage in server rack 20 and is included in back-up battery rack 10 for secondary usage, has been described. In this respect, when completing the secondary usage in back-up battery rack 10, the battery module may be further utilized (i.e., third usage) for lighter and less important purposes. Monitoring device 30 is configured to monitor each of the battery modules in back-up battery rack 10. With this configuration, it is possible to plan to transfer the corresponding battery module when the secondary usage has completed; and each of the battery modules is effectively and fully used. Note that, the third usage may be planned for other purposes in addition to the usages in data center C1.

Back-up power supply system 1 according to the foregoing exemplary embodiment is applied to data center C1; however, the present invention is not limited thereto. Back-up power supply system 1 may be similarly applied as a back-up power supply system in a factory, an office building, or the like. Further, with back-up power supply system 1 according to the foregoing exemplary embodiment, when data center C1 includes both a server rack storing battery modules and a server rack not storing any battery module, it is possible to supply an emergency power source to a server included in the server racks.

Note that, the exemplary embodiment may be identified by the items described below.

[Item 1]

Provided is back-up power supply system (1) for data center (C1), back-up power supply system (1) including:
  server rack (20) that is located in data center (C1) and includes server (SV1) and at least one battery module (M1) for supplying an emergency power source to server (SV1);
  back-up battery rack (10) that is located in data center (C1) and includes a plurality of battery modules (M11 to M3n) for supplying an emergency power source to other devices than server (SV1); and
  monitoring device (30) configured to monitor a battery characteristic of each of battery modules (Mn).

In back-up power supply system (1), the plurality of battery modules (M11 to M3n) included in back-up battery rack (10) correspond to a plurality of battery modules (M11 to M3n), each of which has completed a primary usage as the emergency power source in server rack (20), and
  monitoring device (30) determines a system configuration of the plurality of battery modules (M11 to M3n) in back-up battery rack (10), based on a specification required for back-up battery rack (10) and a history characteristic of battery module (M1) that has completed the primary usage in server rack (20).

With this configuration, it is possible to reuse battery module (M1) included in data center (C1) at lower cost.

[Item 2]

In back-up power supply system (1) for data center (C1) according to item 1, back-up battery rack (10) includes a plurality of rows, each of which has:
  the plurality of battery modules (M11 to M1n, M21 to M2n, M31 to M3n), each of which has completed the primary usage and is removable; and
  DC/DC converters (11 to 13), each of which is configured to control both charge and discharge of a corresponding one of the plurality of battery modules (M11 to M1n, M21 to M2n, M31 to M3n) that has completed the primary usage,
  a plurality of DC/DC converters (11 to 13) disposed in the plurality of rows are connected in parallel to each other, and
  monitoring device (30) determines a series and parallel configuration of the plurality of battery modules (M11 to M3n), each of which has completed the primacy usage and is included in back-up battery rack (10), in order to cause a plurality of battery blocks (B1 to B3) in back-up battery rack (10) to respectively show a battery performance closer to each other.

With this configuration, it is possible to form back-up battery rack (10) that satisfies a required specification by using the plurality of battery modules (M11 to M1n, M21 to M2n, M31 to M3n), each of which has completed the primary usage.

[Item 3]

In back-up power supply system (1) for data center (C1) according to item 2, monitoring device (30) determines the series and parallel configuration of the plurality of battery modules (M11 to M3n), each of which has completed the primary usage and is included in back-up battery rack (10), in order to cause the plurality of battery blocks (B1 to B3) to respectively show a dynamic discharge characteristic closer to each other.

With this configuration, it is possible to reduce a conversion loss in each of DC/DC converters (11 to 13).

[Item 4]

In back-up power supply system (1) for data center (C1) according to item 2 or 3, each of the plurality of DC/DC converters (11 to 13) disposed in a corresponding one of the plurality of rows controls the discharge of the plurality of battery modules (M11 to M1n, M21 to M2n, M31 to M3n), each of which has completed the primary usage and is included in a corresponding one of the plurality of battery blocks (B1 to B3), in order to cause each of the plurality of battery blocks (B1 to B3) to show an output voltage maintained at a shared target voltage.

With this configuration, during the discharge, it is possible to reduce a cross current flow between the plurality of battery blocks (B1 to B3) connected in parallel to each other.

[Item 5]

In back-up power supply system (1) for data center (C1) according to any one of items 2 to 4, based on a range of state of charge (SOC) usage in each of battery blocks (B1 to B3), monitoring device (30) determines the series and parallel configuration of the plurality of battery modules (M11 to M3n), each of which has completed the primary usage and is included in back-up battery rack (10), in order to satisfy the specification required for back-up battery rack (10).

With this configuration, it is possible to flexibly set up the range of SOC usage in each of battery blocks (B1 to B3) and to appropriately prioritize a service life or prioritize an output performance.

[Item 6]

In back-up power supply system (1) for data center (C1) according to any one of items 1 to 5, the plurality of battery modules (M11 to M1n, M21 to M2n, M31 to M3n), each of which has completed the primary usage and is included in a corresponding one of a plurality of rows, are stored sequentially from a bottom of each of the rows.

With this configuration, back-up battery rack (10) is physically stabilized.

[Item 7]

Provided is back-up battery rack (10) for data center (C1), back-up battery rack (10) included in back-up power supply system (1) for data center (C1), back-up power supply system (1) including:
  server rack (20) that is located in data center (C1) and includes server (SV1), and at least one battery module (M1) for supplying an emergency power source to server (SV1); and
  monitoring device (30) configured to monitor a battery characteristic of each of battery modules (Mn),
  back-up battery rack (10) being located in data center (C1) and including a plurality of battery modules (M11 to M3n) for supplying an emergency power source to other devices than server (SV1).

In back-up battery rack (10) for data center (C1), the plurality of battery modules (M11 to M3n) included in back-up battery rack (10) correspond to a plurality of battery modules (M11 to M3n), each of which has completed a primary usage as the emergency power source in server rack (20), and monitoring device (30) determines a system configuration of the plurality of battery modules (M11 to M3n) in back-up battery rack (10), based on a specification required for back-up battery rack (10) and a history characteristic of battery module (M1) that has completed the primary usage in server rack (20).

With this configuration, it is possible to reuse battery module (M1) included in data center (C1) at lower cost.

REFERENCE MARKS IN THE DRAWINGS

C1 data center
R1 back-up power supply chamber
R2 server chamber
R3 monitoring chamber
10 back-up battery rack
20 server rack
30 monitoring device
40 load
M1 to M3n battery module
SV1 server
1 back-up power supply system
2 commercial power system
B1-B3 battery block
11 to 13 DC/DC converter
50 power converter
50a master management part
11a to 13a block management part
31 controller
32 storage unit
32a usage history database
33 communication unit
34 display unit
35 operating unit
M1a to Mna battery unit
Mn1 to Mnb measuring unit
M1c to Mnc DC/DC converter
11c charging DC/DC converter
11d discharging DC/DC converter

The invention claimed is:

1. A back-up power supply system for a data center, the back-up power supply system comprising:
a server rack that is located in the data center and includes a server and at least one battery module for supplying an emergency power source to the server;
a back-up battery rack that is located in the data center and includes a plurality of battery modules for supplying an emergency power source to other devices than the server; and
a monitoring device configured to monitor a battery characteristic of each of the at least one battery module and the plurality of battery modules,
wherein
each of the plurality of battery modules included in the back-up battery rack has completed a primary usage as the emergency power source in the server rack and is reused in the back-up battery rack, and
the monitoring device determines a system configuration of the plurality of battery modules in the back-up battery rack, based on a specification required for the back-up battery rack and a history characteristic of each of the plurality of the battery modules that has completed the primary usage in the server rack.

2. The back-up power supply system for a data center according to claim 1, wherein
the back-up battery rack includes a plurality of rows, each of which includes:
the plurality of battery modules, each of which has completed the primary usage and is removable; and
a direct current-direct current converter configured to control charge and discharge of each of the plurality of battery modules that has completed the primary usage,
a plurality of the direct current-direct current converters disposed in the plurality of rows are connected in parallel to each other, and
the monitoring device determines a series and parallel configuration of the plurality of battery modules, each of which has completed the primary usage and is included in the back-up battery rack, in order to cause a plurality of battery blocks in the back-up battery rack to respectively show a battery performance closer to each other.

3. The back-up power supply system for a data center according to claim 2, wherein the monitoring device determines the series and parallel configuration of the plurality of battery modules, each of which has completed the primary usage and is included in the back-up battery rack, in order to cause the plurality of battery blocks to respectively show a dynamic discharge characteristic closer to each other.

4. The back-up power supply system for a data center according to claim 2, wherein each of the plurality of direct current-direct current converters disposed in a corresponding one of the plurality of rows controls discharge of the plurality of battery modules, each of which has completed the primary usage and is included in a corresponding one of the plurality of battery blocks, in order to cause each of the plurality of battery blocks to show an output voltage maintained at a shared target voltage.

5. The back-up power supply system for a data center according to claim 2, wherein the monitoring device determines the series and parallel configuration of the plurality of battery modules, each of which has completed the primary usage and is included in the back-up battery rack, based on a range of state of charge (SOC) usage in each of the plurality of battery blocks, in order to satisfy the specification required for the back-up battery rack.

6. The back-up power supply system for a data center according to claim 1, wherein the plurality of battery modules, each of which has completed the primary usage and is included in a corresponding one of a plurality of rows, are stored sequentially from a bottom of each of the plurality of rows.

7. A back-up battery rack for a data center, the back-up battery rack included in a back-up power supply system for the data center, the back-up power supply system including:
a server rack that is located in the data center and includes a server and at least one battery module for supplying an emergency power source to the server; and
a monitoring device configured to monitor a battery characteristic of each battery module, the back-up battery rack being located in the data center and including a plurality of battery modules for supplying an emergency power source to other devices than the server,
wherein
each of the plurality of battery modules included in the back-up battery rack has completed a primary usage as the emergency power source in the server rack and is reused in the back-up battery rack, and
the monitoring device determines a system configuration of the plurality of battery modules in the back-up battery rack, based on a specification required for the back-up battery rack and a history characteristic of each of the plurality of the battery modules that has completed the primary usage in the server rack.

* * * * *